(12) United States Patent
Chen et al.

(10) Patent No.: US 10,319,872 B2
(45) Date of Patent: Jun. 11, 2019

(54) COST-EFFICIENT HIGH POWER PECVD DEPOSITION FOR SOLAR CELLS

(75) Inventors: Tze-Chiang Chen, Yorktown Heights, NY (US); Augustin J. Hong, White Plains, NY (US); Jeehwan Kim, Los Angeles, CA (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 302 days.

(21) Appl. No.: 13/468,292

(22) Filed: May 10, 2012

(65) Prior Publication Data

US 2013/0298971 A1 Nov. 14, 2013

(51) Int. Cl.
*H01L 31/076* (2012.01)
*H01L 31/077* (2012.01)
(Continued)

(52) U.S. Cl.
CPC ........ *H01L 31/077* (2013.01); *C23C 16/0272* (2013.01); *C23C 16/45523* (2013.01); *C23C 16/45557* (2013.01); *C23C 16/50* (2013.01); *C23C 16/515* (2013.01); *H01L 21/0262* (2013.01); *H01L 21/02532* (2013.01); *H01L 31/02167* (2013.01); *H01L 31/022466* (2013.01); *H01L 31/022475* (2013.01); *H01L 31/022483* (2013.01); *H01L 31/03682* (2013.01); *H01L 31/03687* (2013.01); *H01L 31/03762* (2013.01); *H01L 31/03921* (2013.01); *H01L 31/056* (2014.12); *H01L 31/065* (2013.01); *H01L 31/1816* (2013.01); *H01L 31/20* (2013.01); *Y02E 10/52* (2013.01); *Y02E 10/546* (2013.01); *Y02E 10/548* (2013.01)

(58) Field of Classification Search
CPC ............. H01L 21/02532; H01L 21/205; H01L 21/0262; H01L 31/076; H01L 31/077; C23C 16/24
USPC .................................................. 438/478, 485
See application file for complete search history.

(56) References Cited

U.S. PATENT DOCUMENTS 6,072,117 A * 6/2000 Matsuyama et al. ......... 136/256
6,238,941 B1 5/2001 Dutartre et al.
(Continued)

FOREIGN PATENT DOCUMENTS

CN 1716552 A 1/2006

OTHER PUBLICATIONS

Ballutaud, J., et al. "Reduction of the Boron Cross-Contamination for Plasma Deposition of P-I-N Devices in a Single-Chamber Large Area Radio-Frequency Reactor" Thin Solid Films, vol. 468, Issues 1-2. Dec. 2004. pp. 222-225.
(Continued)

*Primary Examiner* — Lex H Malsawma
*Assistant Examiner* — Eric W Jones
(74) *Attorney, Agent, or Firm* — Tutunjian & Bitetto, P.C.; Erik Johnson

(57) ABSTRACT

A method for forming a photovoltaic device includes providing a substrate. A layer is deposited to form one or more layers of a photovoltaic stack on the substrate. The depositing of the amorphous layer includes performing a high power flash deposition for depositing a first portion of the layer. A low power deposition is performed for depositing a second portion of the layer.

17 Claims, 6 Drawing Sheets

(51) Int. Cl.

| | | |
|---|---|---|
| C23C 16/50 | (2006.01) | |
| H01L 31/20 | (2006.01) | |
| H01L 21/02 | (2006.01) | |
| C23C 16/02 | (2006.01) | |
| H01L 31/0216 | (2014.01) | |
| H01L 31/0368 | (2006.01) | |
| H01L 31/0376 | (2006.01) | |
| H01L 31/0392 | (2006.01) | |
| C23C 16/455 | (2006.01) | |
| C23C 16/515 | (2006.01) | |
| H01L 31/0224 | (2006.01) | |
| H01L 31/065 | (2012.01) | |
| H01L 31/18 | (2006.01) | |
| H01L 31/056 | (2014.01) | |

(56) References Cited

U.S. PATENT DOCUMENTS

| | | | |
|---|---|---|---|
| 6,607,790 B1 | 8/2003 | Musaka | |
| 6,613,603 B1* | 9/2003 | Sano | 438/72 |
| 2001/0051388 A1* | 12/2001 | Shiozaki et al. | 438/57 |
| 2002/0160124 A1* | 10/2002 | Murayama | G03G 5/08278 427/569 |
| 2003/0049558 A1* | 3/2003 | Aoki | G03G 5/08278 430/128 |
| 2003/0196601 A1* | 10/2003 | Murayama | H01J 37/32082 118/723 E |
| 2004/0147115 A1* | 7/2004 | Goundar | C23C 16/325 438/687 |
| 2004/0161535 A1* | 8/2004 | Goundar | C23C 16/325 427/249.15 |
| 2006/0211243 A1* | 9/2006 | Ishizaka | C23C 16/14 438/680 |
| 2007/0177092 A1 | 8/2007 | Hosoya | |
| 2007/0212811 A1 | 9/2007 | Hanawa et al. | |
| 2008/0128698 A1 | 6/2008 | Martin et al. | |
| 2008/0173348 A1* | 7/2008 | Nasuno | H01L 31/076 136/255 |
| 2008/0188090 A1* | 8/2008 | Chen | H01J 37/321 438/778 |
| 2008/0264480 A1 | 10/2008 | Choi et al. | |
| 2009/0047752 A1* | 2/2009 | Yamazaki | C23C 16/24 438/96 |
| 2009/0047775 A1* | 2/2009 | Yamazaki | H01L 27/124 438/488 |
| 2009/0238998 A1 | 9/2009 | Stowell et al. | |
| 2009/0272423 A1 | 11/2009 | Niira et al. | |
| 2010/0009096 A1* | 1/2010 | Kawamura | C23C 16/24 427/569 |
| 2010/0068870 A1 | 3/2010 | Ovshinsky | |
| 2010/0330299 A1* | 12/2010 | Moon | C23C 16/24 427/569 |
| 2011/0120537 A1* | 5/2011 | Liu | H01L 21/02532 136/255 |
| 2011/0174362 A1 | 7/2011 | Tanner et al. | |
| 2011/0180134 A1* | 7/2011 | Kim | H01L 31/022425 136/256 |
| 2011/0272015 A1* | 11/2011 | Kim | H01L 31/02363 136/255 |
| 2012/0031477 A1 | 2/2012 | Fogel et al. | |
| 2012/0031561 A1* | 2/2012 | Kim | H01J 37/32091 156/345.48 |
| 2012/0048361 A1* | 3/2012 | Chang | H01L 31/022433 136/256 |
| 2012/0048379 A1* | 3/2012 | Chang | H01L 31/02167 136/265 |
| 2012/0052619 A1* | 3/2012 | Ishikawa | C23C 16/22 438/93 |
| 2012/0097236 A1* | 4/2012 | Hu | H01L 31/02167 136/256 |
| 2012/0138134 A1* | 6/2012 | Higashikawa | H01L 31/02167 136/255 |
| 2012/0168633 A1* | 7/2012 | Tredwell | G01T 1/2018 250/370.08 |

OTHER PUBLICATIONS

U.S. Appl. No. 12/968,490. "Photovoltaic Devices With an Interfacial Germanium-Containing Layer and Methods for Forming the Same", filed Dec. 15, 2010. (31 Pages).
Final Office Action dated Jul. 14, 2016 issued in U.S. Appl. No. 14/717,482, 14 pages.
U.S. Notice of Allowance issued in U.S. Appl. No. 14/976,798 dated Oct. 24, 2017, pp. 1-10.
U.S. Office Action issued in U.S. Appl. No. 14/717,482, dated Jun. 15, 2018, pp. 1-18.
German Office Action issued in German Application No. 102013207490.5, dated Apr. 7, 2017, 10 pages.

* cited by examiner

COST-EFFICIENT HIGH POWER PECVD DEPOSITION FOR SOLAR CELLS

BACKGROUND

Technical Field

The present invention relates to photovoltaic devices and methods for fabrication, and more particularly to systems, devices and fabrication methods that improve efficiency by employing dual power deposition steps.

Description of the Related Art

A barrier height is a difference between work functions of different materials. The barrier height is affected by the type of material with which the semiconductor is in contact. A band offset is the measure of misalignment between energy levels at the interface between two solids. The offset between an electrode and a semiconductor is called a "Schottky barrier". The barrier height and offset are measures of how much a given material resists the flow of electrical charge through a medium. Both semiconductor-semiconductor band offset and semiconductor-electrode Schottky barrier decrease solar cell efficiency.

To improve solar efficiency, barrier heights and barrier offsets may be addressed by material selection. However, material selection alone is often inadequate as an appropriate material may not exist with the required characteristics to provide an optimal transition in energy bands between adjacent materials.

SUMMARY

A method for forming a photovoltaic device includes providing a substrate. A layer is deposited to form one or more layers of a photovoltaic stack on the substrate. The depositing of the amorphous or microcrystalline layer includes performing a high power flash deposition for depositing a first portion of the layer. A low power deposition is performed for depositing a second portion of the layer.

Another method for forming a photovoltaic device includes providing a substrate and depositing a buffer layer between a transparent electrode formed on the substrate and a p-type layer of a photovoltaic stack, the depositing of the buffer layer including the steps of: performing a high power flash deposition for depositing a first portion of the buffer layer to increase crystallinity and conductivity of the buffer layer; and performing a low power deposition for depositing a second portion of the buffer layer and having a more amorphous form.

A plasma enhanced chemical vapor deposition (PECVD) system includes a vacuum chamber configured to receive a substrate for forming a photovoltaic device. A first power generator is configured to generate an electric field in the vacuum chamber for performing a high power PECVD flash deposition for depositing a first portion of a layer on the substrate. The layer being included in one or more layers of a photovoltaic stack. A second power generator is configured to generate an electric field in the vacuum chamber for performing a low power PECVD deposition for depositing a second portion of the layer on the substrate.

A photovoltaic device includes a substrate; and at least one layer including a buffer layer or a p-type layer of a photovoltaic stack on the substrate. The at least one layer includes a first portion of the layer and a second portion of the layer. The first and second portions of the layer include different crystallinity levels, and the different crystallinity levels are provided adjacent to other layers such that use of the different crystallinity levels better transitions band gap energies between layers.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
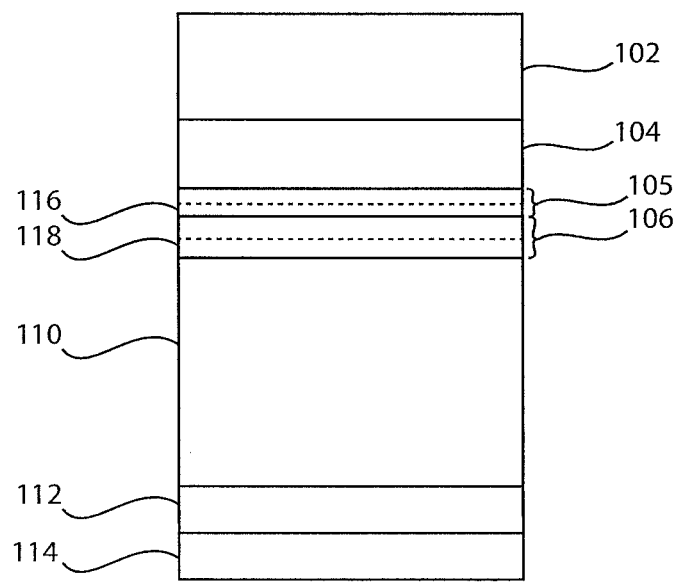
FIG. 1 is a cross-sectional view of a photovoltaic device with a buffer layer formed in accordance with the present principles.

In accordance with the present principles, methods and devices are presented that provide improved efficiency based upon deposition parameters of layers formed for semiconductor devices and in particular for photovoltaic cells. Layers for semiconductor devices are often deposited using low deposition energies. Low deposition energies are favored by manufacturing since the low energy permits high quality a-Si:H layer deposition and less energy results in lower process costs. Designers also prefer low deposition energies since the low energies create plasma with less energy bombardment on a surface resulting in less damage to existing structures on semiconductor devices. In thin film Si solar cell applications, high deposition energies are desired for depositing a p+ layer since the higher energies increase the likelihood that a microcrystalline phase will form. The microcrystalline phase can reduce barrier heights between the p+ layer and an electrode (e.g., formed from a transparent conductive oxide (TCO)).

For example, photovoltaic stacks and, in particular, p-i-n structures (a p-type layer, an intrinsic layer, an n-type layer) or n-i-p structures (an n-type layer, an intrinsic layer, a p-type layer) include layers where a band offset at an interface can be improved based upon the crystallinity of the layers—the higher power, the higher the crystallinity. Higher crystallinity penults for tunneling current through the barrier. In useful examples, such improvements can be gained at an interface between a transparent conductive oxide (TCO) to the p+ layer. A band offset at the TCO/p+ layer is unavoidable since all developed TCO films are n-type. In particularly useful embodiments, photovoltaic devices are constructed using materials and processes that adjust deposition power for the formation of layers, e.g., a buffer layer at the TCO/p+ interface. To provide improved efficiency, the manner in which the buffer layer and other layers are formed may be addressed in accordance with the present principles. In one example, a buffer layer is deposited between the TCO and the p$^+$ layer of the device using a deposition process designed to improve device efficiency. In particularly useful embodiments, low power deposition may be employed to deposit a bulk portion of the layer followed by a high power flash deposition to finish the layer.

Methods and devices provide a deposition process and power settings that improve device efficiency. In one embodiment, a buffer layer may include Ge or $Ge_xSi_{1-x}$, which is disposed between the TCO layer and the p+ layer of the solar cell. The Ge is deposited using power deposition settings that are adjusted to reduce band offsets between materials and to increase crystallinity of the Ge or GeSi buffer layer. The Ge is preferably deposited using a high power deposition process to affect the properties of the buffer layer to increase efficiency of the device. The high power deposition process will be implemented as a flash process lasting less than about 5 seconds. In another embodiment, the p+ layer or p-type layer is deposited or processed to reduce band offsets by a flash high deposition power process. This may be performed in addition to or instead of the buffer layer processing. Other layers in the structures may also be processed using the high deposition power flash.

In accordance with the present principles, layers are deposited by high power plasma deposition, and, in particular, a high power plasma enhanced chemical vapor deposition (PECVD) process. In one embodiment, plasma is provided by a dual power system. A low power system supplies plasma for a regular deposition while a second power supply provides a high power short duration flash deposition. In another embodiment, a high power supply system is locally installed to deposit layers, e.g., provide a scanning deposition of p-i-n (n-i-p) layers on a photovoltaic device.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit or board may be embodied in a graphical computer programming language, and stored in a computer storage medium (such as a disk, tape, physical hard drive, or virtual hard drive such as in a storage access network). If the designer does not fabricate chips or photovoltaic devices, the designer may transmit the resulting design by physical means (e.g., by providing a copy of the storage medium storing the design) or electronically (e.g., through the Internet), directly or indirectly.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

It should be further understood that material compounds will be described in terms of listed elements, e.g., SiC, SiGe, etc. These compounds include different proportions of the elements within the compound, e.g., $Si_xC_y$ where $x/y \neq 1$, etc. In addition, other elements may be included in the compound and still function in accordance with the present principles.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors or other photovoltaic applications. Structure 100 includes a substrate 102 that permits a high transmittance of light. The substrate 102 may include a transparent material, such as glass, a polymer, etc. or combinations thereof.

A first electrode 104 includes a transparent conductive material. Electrode 104 may include a transparent conductive oxide (TCO), such as, e.g., a fluorine-doped tin oxide ($SnO_2$:F, or "FTO"), doped zinc oxide (e.g., ZnO:Al), indium tin oxide (ITO) or other suitable materials. For the present example, a doped zinc oxide is illustratively employed for electrode 104. The TCO 104 permits light to pass through to an active light-absorbing material beneath and allows conduction to transport photo-generated charge carriers away from that light-absorbing material. The TCO 104 may be deposited by a chemical vapor deposition (CVD) process, a low pressure CVD (LPCVD) process or a plasma-enhanced (PE-CVD) process.

A buffer layer 105 may be employed. Buffer layer 105 may include germanium or silicon germanium and may include a p-type dopant such as B, Ga, In or combinations thereof. In one embodiment, the buffer layer 105 includes a silicon-germanium alloy layer including germanium, silicon, optionally a p-type dopant, and hydrogen. In this embodiment, the atomic concentration of germanium may be greater than 50%. Depending on the work-function of TCO 104, Si content in Ge can be varied. The buffer layer 105 has a greater atomic concentration of germanium than a p-doped layer 106 formed on the buffer layer 105.

The buffer layer 105 can be amorphous, microcrystalline, or single crystalline. The buffer layer 105 may include a hydrogenated material. For example, if the buffer layer 105 includes a hydrogenated amorphous silicon germanium alloy, a hydrogenated microcrystalline silicon-germanium alloy, a hydrogenated amorphous germanium, or a hydrogenated microcrystalline germanium, the hydrogenation of the material of the buffer layer 105 decreases localized electronic states and increases the conductivity of the buffer layer 105. A hydrogenated amorphous germanium may be formed using $GeH_4$ plasma.

The buffer layer 105 can be formed, for example, by plasma enhanced chemical vapor deposition (PECVD). In accordance with the present principles, the buffer layer 105 is formed with a dual process including a low power deposition and a high power flash deposition. In one embodiment, the low power deposition may include a power of between about 1.0 mW/cm$^2$ and about 100 mW/cm$^2$, and the high power flash deposition may include a power of between about 100 mW/cm$^2$ and about 100 W/cm$^2$. The deposition temperature for either process may be maintained at between about 200 degrees C. to about 300 degrees C., although other temperatures may be employed. Either process may be performed first depending on the desired crystallinity of the completed layer. The high power deposition includes a power higher than the low power deposition to provide thicknesses of the same layer that have different levels or crystallinity. This better transitions band gap energies between layers.

The thickness of the buffer layer 105 can be from about 1 nm to about 30 nm, although lesser and greater thicknesses can also be employed. All the barriers, e.g., between TCO 102 and the buffer layer 105 and between the buffer layer 105 and the p+ layer 106, exist at valence band locations. One purpose of having the buffer layer 105 is to make a mid-gap bridge between TCO 102 and p+ layer 106.

In the case of FIG. 1, the low power deposition is performed first followed by the high power flash to increase crystallinity towards the p+ layer 106. In this case, the buffer layer 105 includes an interfacial layer 116 with higher crystallinity (microcrystalline) than the remaining portions of the buffer layer 105. The buffer layer 105, with the interface layer 116, better aligns the Fermi level between the TCO layer 104 (e.g., ZnO) and the p-type layer 106 (e.g., a-SiC:H). The Fermi level of the TCO layer 104 in the case of ZnO is about 4.5 eV. Without the buffer layer 105, a larger Schottky barrier exists between the TCO 104 and the p-type layer 106. With the buffer layer 105, the Fermi levels of TCO 104 and the buffer layer 105 are well-aligned reducing the barrier offset. A conduction band between the buffer layer 105 and the p-type layer 106 is also well-aligned. In this way, the Schottky barrier is reduced or eliminated resulting in better conduction and more efficient device operation by permitting higher open circuit voltage ($V_{OC}$) without sacrificing fill factor (FF). In particularly useful embodiments, it is believed that increased crystallinity of the buffer layer 105 and in particular the interface layer 116 correlates with increased open circuit voltage ($V_{OC}$) while at least maintaining fill factor (FF).

The p-doped layer 106 may include an amorphous, microcrystalline, or single-crystalline p-doped silicon-containing material. The p-doped layer 106 can be a p-doped silicon layer including: silicon and at least one p-type dopant and optionally hydrogen; a p-doped silicon-carbon alloy layer including: silicon, carbon, at least one p-type dopant and optionally hydrogen. Other materials may also be employed.

In some cases, the p-doped layer 106 may include a hydrogenated amorphous, microcrystalline, or single-crystalline p-doped silicon-containing material. A hydrogenated p-doped silicon-containing material can be deposited in a process chamber having a silicon-containing reactant gas as a carrier gas. To facilitate incorporation of hydrogen in the hydrogenated p-doped silicon-containing material, a carrier gas including hydrogen can be employed. Hydrogen atoms in the hydrogen gas within the carrier gas are incorporated into the deposited material to form an amorphous or microcrystalline hydrogenated p-doped silicon-containing material of the p-doped layer 106.

In one embodiment, p-doped or p-type layer 106 includes boron as a dopant, although other p-type dopants may be employed. Layer 106 may be deposited using diborane gas, trimethylborane or other gases. The p-type layer 106 may have a thickness of between about 5-30 nm. In particularly useful embodiments, layer 106 includes amorphous SiC or Si. The processing of the p-type layer 106 also can affect the efficiency of the device. For example, the deposition parameters for depositing the p-type layer 106 may be selected to increase the effects of the buffer layer 105.

The p-type layer 106 can be formed, for example, by plasma enhanced chemical vapor deposition (PECVD). As with the buffer layer 105 or any other layer in the device 100, the two-part deposition process may be employed that includes a low power deposition and a high power flash deposition. As before, the low power deposition may include a power of between about 1.0 and about 100 mW/cm$^2$, and the high power flash deposition may include a power of between about 100 mW/cm$^2$ and about 100 W/cm$^2$. The deposition temperature for either process may be maintained at between about 200 degrees C. to about 300 degrees C., although other temperatures may be employed. Either process may be performed first depending on the desired crystallinity of the completed layer.

The thickness of the p-type layer 106 can be from about 5 nm to about 30 nm, although lesser and greater thicknesses can also be employed. For the smaller thicknesses, the high power flash deposition may be employed alone. For example, layer thicknesses of about 5 nm may be formed by the high power flash deposition.

In one embodiment, the high power flash is performed first followed by the low power deposition. In this case, the p-type layer 106 includes an interfacial layer 118 with higher crystallinity than the remaining portions of the p-type layer 106. The p-type layer 106 (e.g., a-SiC:H) is better aligned in terms of the Fermi level with the TCO layer 104 (e.g., ZnO) or the buffer layer 105 (e.g., Ge) (if employed). More efficient device operation is provided by permitting higher open circuit voltage ($V_{OC}$) without sacrificing fill factor (FF). In particularly useful embodiments, it is believed that increased crystallinity of the p-type layer 106 results in enhanced doping efficiency and in particular the interface layer 118 correlates with increased $V_{OC}$ while at least maintaining FF.

Processing continues with the formation of an intrinsic layer 110 formed on layer 106 from compatible materials. Intrinsic layer 110 may be undoped and may include an amorphous silicon material, e.g., hydrogenated amorphous Si (a-Si:H). The intrinsic layer 110 may include a thickness of between about 100-300 nm, although other thicknesses are contemplated. The intrinsic layer 110 may be formed using a chemical vapor deposition (CVD) process, or a plasma-enhanced (PE-CVD), e.g., from silane gas and hydrogen gas.

A doped layer 112 (e.g., an n-type layer) is formed on the intrinsic layer 110. Layer 112 may include an n-type Si containing layer, e.g., hydrogenated microcrystalline (μc-Si:H), single crystalline (Si) or an amorphous (a-Si) layer. Layer 112 may be deposited by a chemical vapor deposition (CVD) process, or a plasma-enhanced (PE-CVD). The n-type layer 112 may have a thickness of between about 5-20 nm. A back reflector and/or bottom electrode 114 may be formed using a reflective metal, such as Ag, Al, etc. and may be combined with ZnO back reflectors. A suitable metal deposition process may be employed, e.g., physical or chemical vapor deposition, sputtering, evaporation, electro or electroless plating, etc. It should be understood that other material selections, layers, structures, etc. may be employed in device 100 including additional back reflectors, etc. or instead of back reflectors: tandem cells, etc.

It should be understood that the structures depicted in FIG. 1 are illustrative and that other structures may be employed, e.g., the p-i-n stack can be reversed (n-i-p). In addition, one or more layers of the device 100 may be formed with the two-part deposition process. In addition, the high power deposition process may be employed alone to form small thickness layers.

In accordance with another embodiment, the high power flash deposition may be employed in multiple pulses to form layers. For example, if the high power flash deposition provides a 3 nm thickness for the buffer layer 105, the high power flash deposition may be repeated four times (four pulses) to achieve a 12 nm buffer layer 105. The high power flash deposited buffer layer 105 would include a higher crystallinity, which results in improved efficiency of operation. The high power flash deposited buffer layer 105 would be more cost effective since the flash pulses would take only a few seconds, and low temperature is maintained therefore maintaining thermal budget and reducing damage to existing layers/structures.

Figure 2:
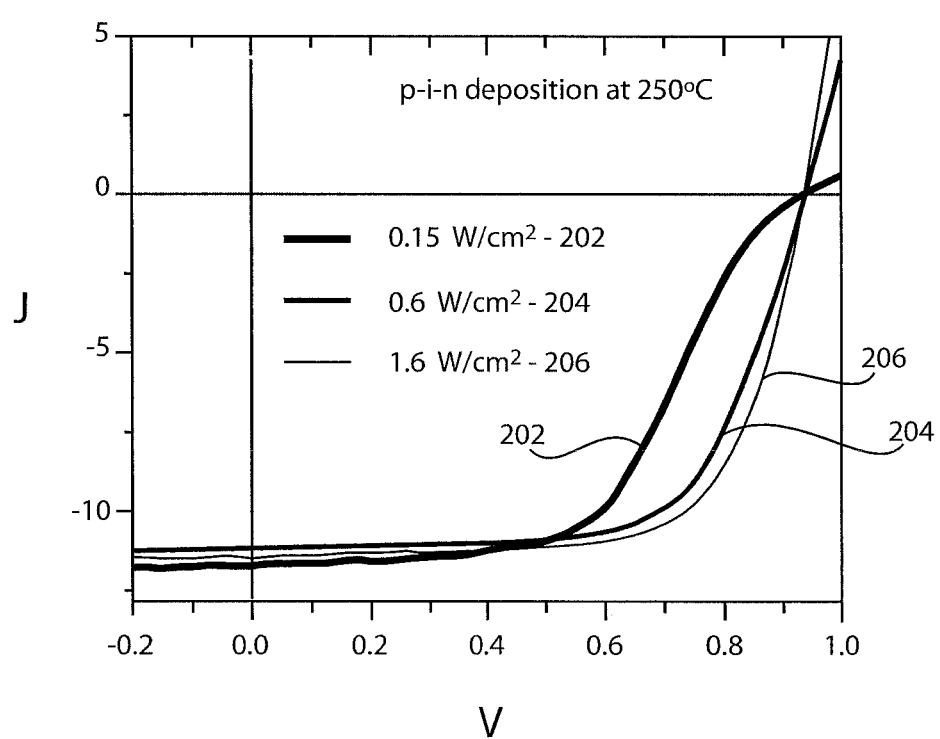
FIG. 2 depicts a graph showing current density ($mA/cm^2$) versus voltage (V) for three different deposition powers for forming a buffer layer to demonstrate an effect of deposition power on the buffer layer.

Referring to FIG. 2, a graph shows general effects of different deposition powers for a buffer layer (e.g., buffer layer 105) in a p-i-n stack photovoltaic device. The graph shows three plots corresponding to different deposition powers for a buffer layer formed from a-GeSi:H. The graph plots current density (J) in mA/cm$^2$ versus voltage (V) in volts for three devices. The deposition powers include the following: 0.15 W/cm$^2$ for plot 202, 0.6 W/cm$^2$ for plot 204 and 1.6 W/cm$^2$ for plot 206. A systematic degradation of FF occurs as the deposition power is reduced. For a power of 0.15 W/cm$^2$ (plot 202), FF was 53%. For a power of 0.6 W/cm$^2$ (plot 204), FF was 66%. For a power of 1.6 W/cm$^2$ (plot 206), FF was 69%. Advantageously, $V_{OC}$ remains high with higher FF.

The plots 202, 204 and 206 correspond to devices that were processed in the same way but for the deposition power of the buffer layer. The devices included p-i-n (p-type, intrinsic, n-type) layers deposited at 250 degrees C. and the p type layer (106) was deposited with a power of 0.6 W/cm$^2$ for these devices. In accordance with these findings, a high power deposition seems to result in improved device efficiency. This may be as a result of increased crystallinity and therefore conductivity of the deposited material and/or other factors. However, high power is expensive, costs thermal budget and may have a destructive effect on adjacent structures. In addition for large area deposition in manufacturing environments, high deposition power is not favored. Large area refers to large scale devices having an illustrative size on the order of feet or meters, e.g., 1.5 meters by 0.6 meters. Such devices may include solar panels. Low power is favored in such environments.

In accordance with the present principles, a high power flash deposition with a low power bulk deposition provides improved device efficiency while permitting a reduction in overall deposition power. In some embodiments, the high power flash deposition may be employed alone to form a layer depending on a thickness needed and a deposition rate provided by the process. In other embodiments, the high power flash deposition may be repeatedly performed in a pulsing fashion to accumulate the needed thickness. The pulses may include a same pulse rate or the pulse rate may be altered for subsequent pulses. The high power flash deposition is preferably a plasma enhanced CVD process and may include a duration (pulse duration) of between 1 millisec to about 5 seconds. Other times are also contemplated and may depend on the application, materials, etc.

Figure 3:
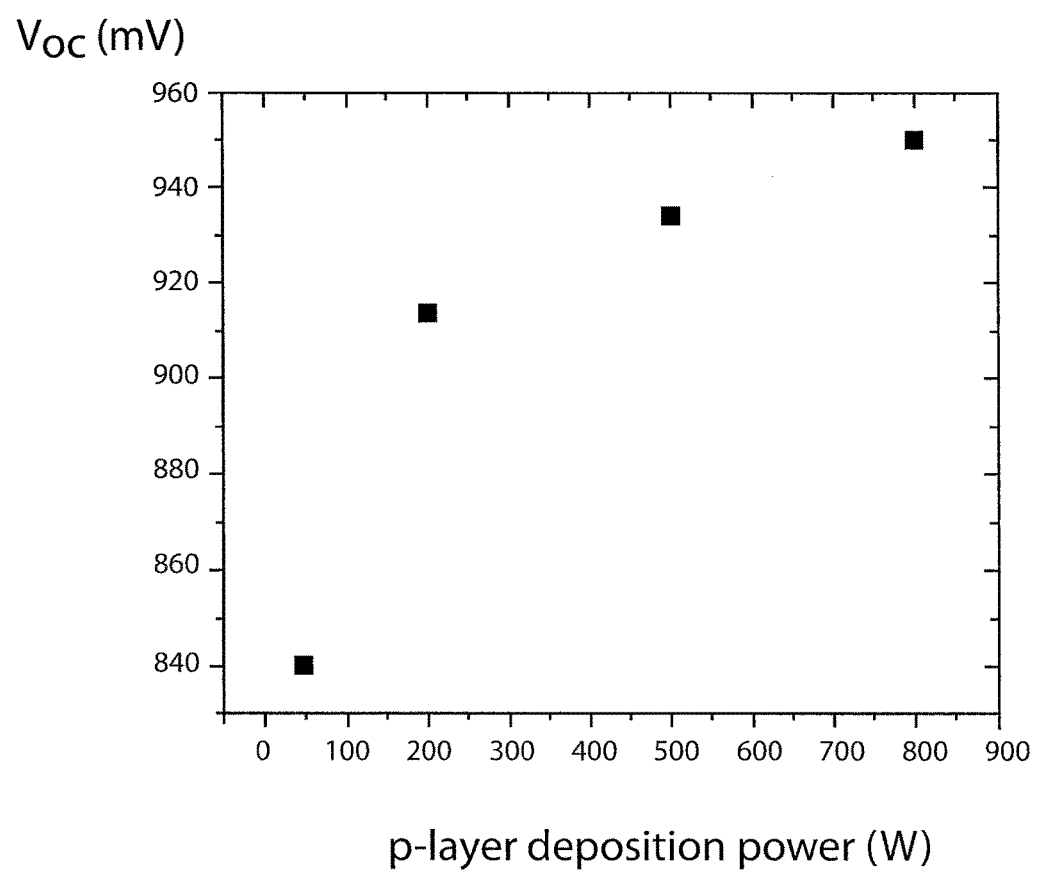
FIG. 3 depicts a graph showing open circuit voltage ($V_{OC}$) versus p-layer deposition power (W) to demonstrate an effect of deposition power on the p-layer.

Referring to FIG. 3, experimental results for devices fabricated using different deposition powers are depicted to show a correlation between deposition power and open circuit voltage ($V_{OC}$) (in millivolts). $V_{OC}$ is graphed versus deposition power (W) for a p-type layer in p-i-n photovoltaic devices. The p-type layer included a p-doped a-Si layer. In accordance with the graph, $V_{OC}$ increased with deposition power.

It should be understood that the deposition power may be increased to levels higher than those depicted herein (e.g., deposition powers of 900 W or greater may be provided) and that comparable improvements may be obtained but may have some limitations. In addition, other parameters may be adjusted as well including duration of a treatment, temperature, etc. It should be understood that the high power deposition may improve other adjacent layers as well including but not limited to the intrinsic layer, which will be illustratively described with respect to FIG. 4, and even the n-type layer.

Figure 4:
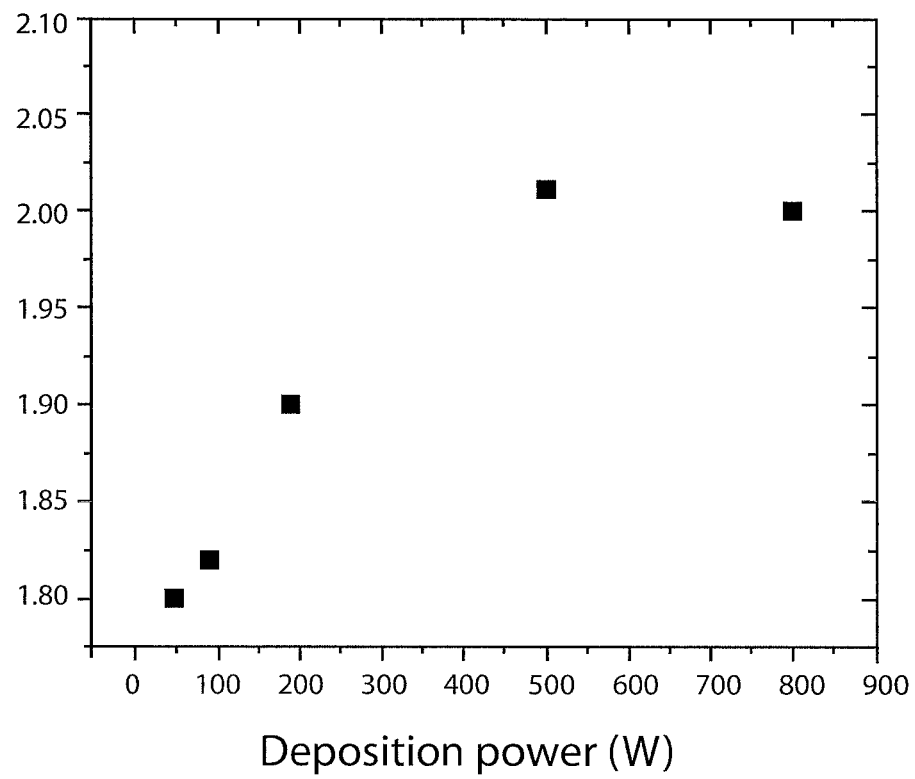
FIG. 4 depicts a graph showing band gap energy (eV) versus deposition power (W) to demonstrate an effect of p-type layer deposition power on the intrinsic layer.

Referring to FIG. 4, experimental results for devices fabricated using different deposition powers are depicted to show a correlation between deposition power of the p-type layer and band gap energy (eV) of the intrinsic layer (e.g., 110, FIG. 1). Band gap is graphed versus deposition power (W) for a-Si p-i-n photovoltaic devices. In accordance with the graph, band gap increased with deposition power until it reached 2.00-2-01 eV.

From FIGS. 2, 3 and 4, higher power deposition provides improvements in efficiency. However, this needs to be balanced against some drawbacks including lifetime efficiency, cost, ease of manufacturing, etc. In accordance with the present principles, a high power flash process is performed in a PECVD chamber to form one or more of a buffer layer and a p-type layer. In particularly useful embodiments, a largest efficiency gain comes from high power flash processing of the p+ type layer and the use of high power flash processing of a buffer layer. In one particularly useful embodiment, a high power flash process includes a power greater than about 100 mW/cm$^2$ for less than about 5 seconds, and more preferably less than one second. The temperature may be about 200-300 degrees C.

Figure 5:
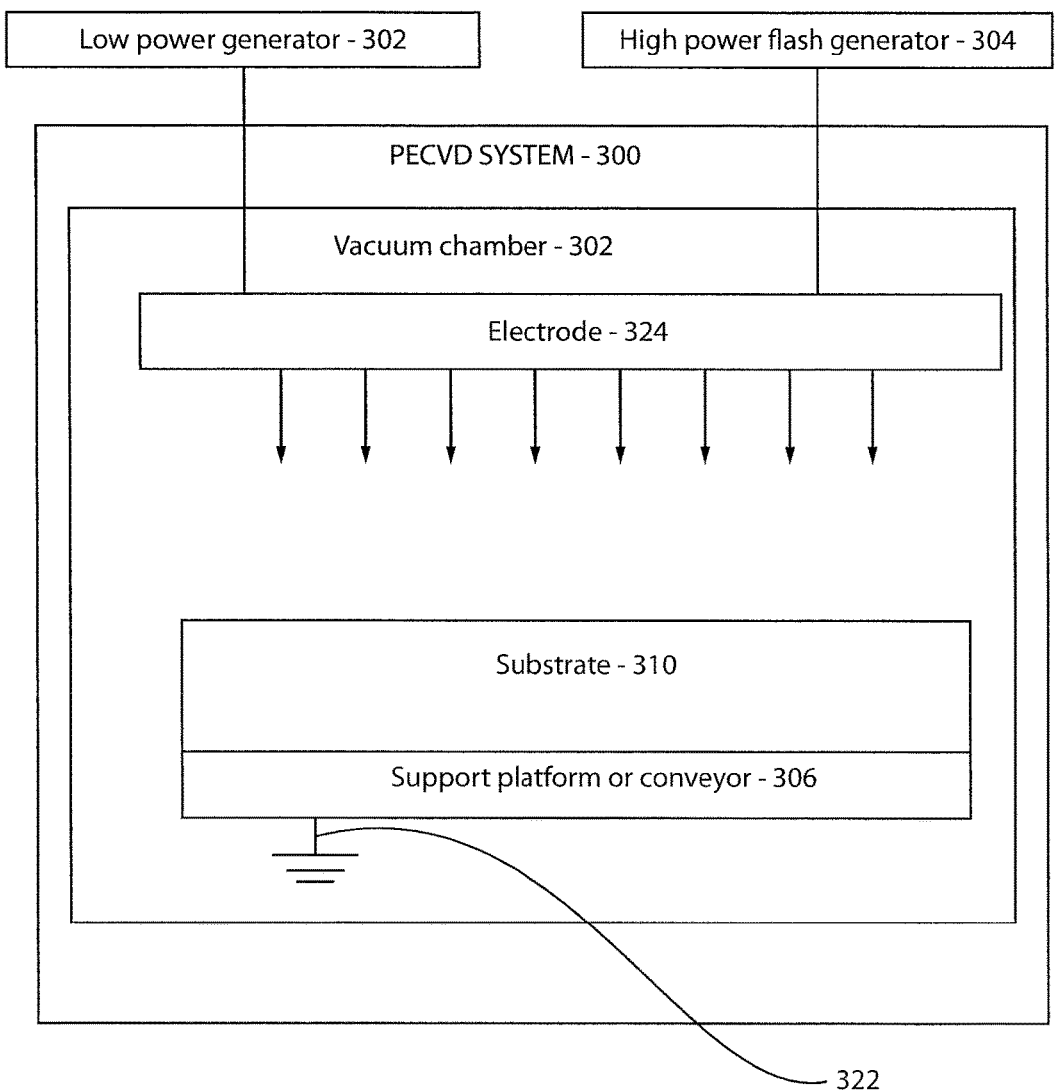
FIG. 5 is a block diagram showing a plasma enhanced chemical vapor deposition (PECVD) system for providing a dual power deposition process in accordance with the present principles.

Referring to FIG. 5, a dual power system 300 is shown in accordance with one illustrative embodiment. The system 300 includes a low power generator 302, which is employed most of time, and a high power generator 304, which is used for a few seconds or less to provide a high power flash process, as described. The generators 302 and 304 include power supplies capable of generating sufficient potential between an electrode 320 and a ground 322. The system 300 may include a vacuum chamber 324 for carrying out a PECVD processes. As is known, plasma includes charged particles/ions accelerated in an electric field (being set by the power settings) to bombard and therefore be deposited on a surface of a device, wafer or panel 310. The system 300 may include a support platform or carrier 306 for supporting the device, wafer or panel 310 on which deposition and other processes are carried out. Platform 306 may include a conveyor or other mechanical device for a manufacturing line. This may be particularly useful for scanning deposition processes, e.g., for fabricating solar panels. The platform 306 also includes the ground 322 to provide a ground potential to the electric field accelerating the plasma particles. Two different electrical feedthroughs 326 and 328, respectively, connect the high power generator 304 and the low power generator 302 to the electrode 320.

In one embodiment, the high power generator 304 is retrofit into an existing chamber to provide the dual power system 300. In other embodiments, a same generator may be employed to perform both the high and low power deposition processes. In still other embodiments, only the high power generator 304 is provided.

The high power generator 304 is configured to provide a higher conductivity to a layer by providing increased crystallinity to an otherwise amorphous or microcrystalline deposition. In one embodiment, the flash deposition may form a thickness of less than about 5 nm in less than about 5 seconds. Other thicknesses and times are also contemplated. The high power generator 304 provides a plasma at a power of between about 100 mW/cm$^2$ and about 100 W/cm$^2$. Higher powers are also contemplated.

In other embodiments, the power generator 304 is configured to pulse to provide a plurality of the high power flash deposition cycles to form multiple layers of high power flash deposited material. For example, 5 cycles may produce a 10 nm layer where each cycle provides 2 nm. In other embodiments, the high power flash deposition cycles may include different pulse durations. For example, a 10 nm layer may be deposited in 3 cycles: a 5 nm deposition cycle, a 3 nm deposition cycle and a 1 nm deposition cycle. Other combinations of thickness and flash durations are also contemplated.

Figure 6:
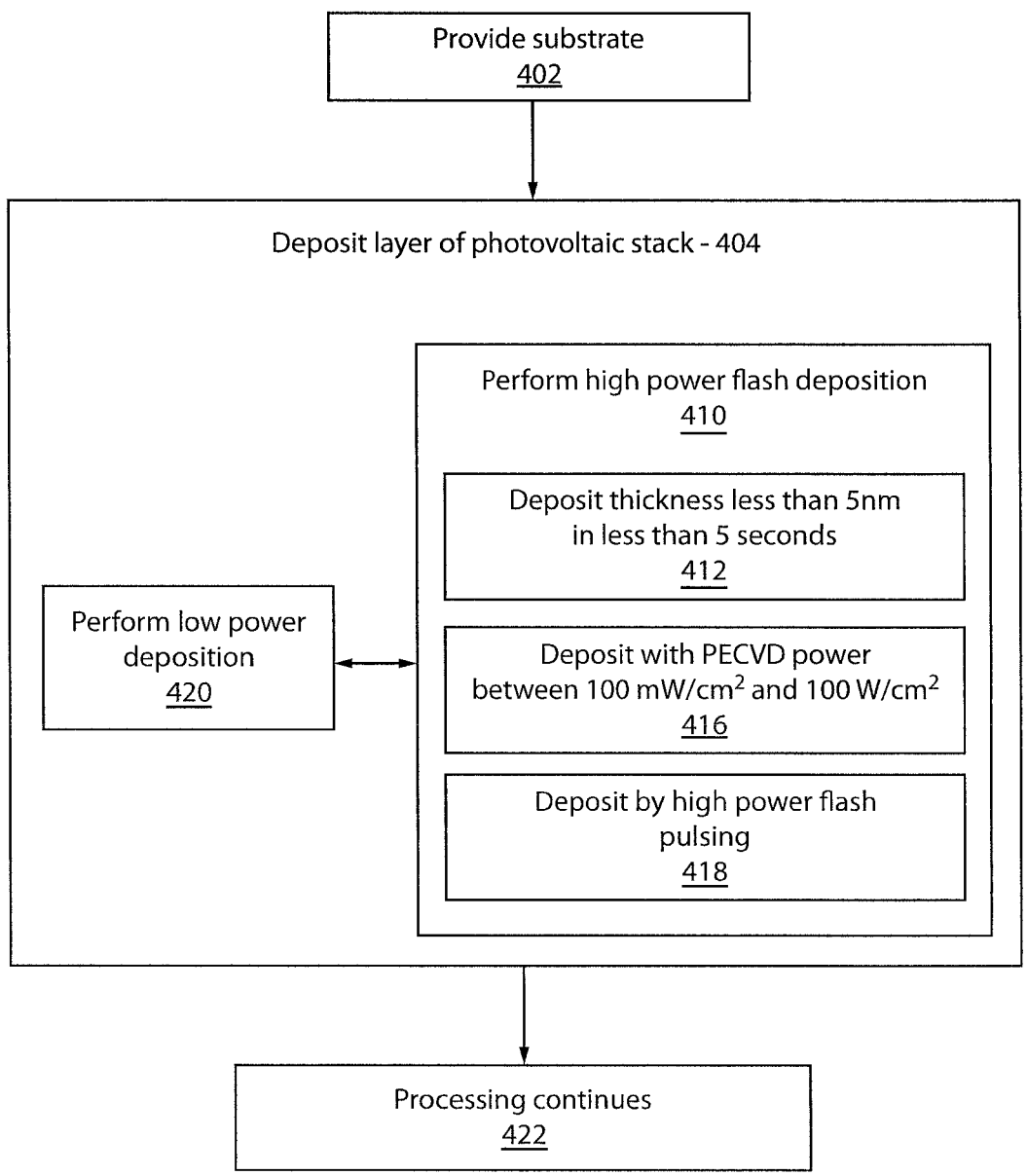
FIG. 6 is a block/flow diagram showing methods for fabricating a photovoltaic device using a dual power deposition in accordance with illustrative embodiments.

Referring to FIG. 6, methods for forming a photovoltaic device are illustratively shown. It should also be noted that, in some alternative implementations, the functions noted in the blocks may occur out of the order noted in FIG. 6. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

In block 402, a substrate is provided. A transparent electrode may be formed on a transparent substrate. The transparent electrode may include a transparent conductive oxide or the like. The transparent substrate may include glass, a polymer, monocrystalline silicon, etc. In block 404, one or more layers of a photovoltaic stack are deposited on the substrate. The depositing step of the one or more layers includes performing a high power flash deposition for depositing a first portion of the layer in block 410. It should be understood that the one or more layers may include deposited amorphous or microcrystalline layers with increased crystallinity and conductivity as a result of the high power flash deposition.

In block 420, a low power deposition is performed for depositing a second portion of the layer. The low power deposition may be eliminated if the high power deposition provides sufficient thickness for the layer. The one or more layers processed using the dual power process may include a p-type layer and a buffer layer, although the process may be employed for other layers as well. In a particularly useful embodiment, the buffer layer and the p-type layer are formed by the dual power process. In block 412, the high power flash deposition may include depositing a thickness of less than about 5 nm in less than about 5 seconds. Other parameters are also contemplated in accordance with the present principles. In block 416, the high power flash deposition may include a plasma enhanced chemical vapor deposition at a power of between about 100 mW/cm$^2$ and about 100 W/cm$^2$. In block 418, the high power flash deposition may include pulsing the high power flash deposition process to form multiple thicknesses of high power flash deposited material in a same layer. Pulses may include different pulse durations. The deposited thickness may increase in crystallinity with depth. This may be performed by increasing the power with each subsequent pulse or gradually increasing the power over time.

The high power flash deposition may be performed before or after the low power deposition. The p-type layer, the intrinsic layer and the n-type layer may be formed at a temperature of about 250 degrees Celsius. Other temperatures may also be employed.

In block 422, processing continues to complete the photovoltaic device. For example, a back reflector or back reflectors may be formed. Other structures and layers are also envisioned. In one embodiment, the p-type layer includes a form of silicon (e.g., a-Si, a-Si:H, a-SiC, a-SiC:H, crystalline forms of Si or SiC, etc.). The intrinsic layer may include a-Si, a-Si:H, or crystalline forms of Si, etc.). The n-type layer may include an n-doped form of a-Si, a-Si:H, or crystalline forms of Si, etc.).

Having described preferred embodiments for cost-efficient high power PECVD deposition for solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
   providing a substrate; and
   depositing a buffer layer of a photovoltaic stack directly on a transparent electrode and between said transparent electrode of zinc oxide and a p-type layer of hydrogenated silicon carbide having a germanium content less than the buffer layer, wherein the buffer layer being a single material layer of silicon germanium is in direct contact with both the transparent electrode and the p-type layer of the photovoltaic stack, the buffer layer comprises a p-type dopant selected from a group consisting of Ga, In and a combination thereof, wherein the depositing the buffer layer comprises using a chemical vapor deposition (CVD) apparatus that includes a high power generator and a low power generator that are separate power generators and are both in communication to an electrode in a single deposition chamber of the PCVD apparatus, the depositing of the single layer includes the steps of:
   performing a high power flash deposition for depositing a first portion of the buffer layer on the substrate within the single deposition chamber, the high power flash deposition employing only the high power generator, wherein the high power flash deposition forms a first portion of the germanium containing material layers having a increasing crystallinity with increasing depth;

performing a low power deposition for depositing a second portion of the buffer layer on the substrate within the single deposition chamber, the lower power deposition employing only the low power generator, wherein the low power deposition forms a second portion of the germanium containing material layers that is amorphous to provide the single layer for the buffer layer and a varying crystal structure having said first portion with said increasing crystallinity with said increasing depth and said second portion being said amorphous, wherein the increasing crystallinity is in a direction towards the p-type layer of hydrogenated silicon to provide for alignment of a conduction band of the buffer layer and the p-type layer of hydrogenated silicon to reduce a Schottky barrier between the buffer layer and the p-type layer of hydrogenated silicon; and forming a intrinsic layer of amorphous silicon on the p-type layer of hydrogenated silicon carbide and an n-type silicon layer to provide a PIN junction.

2. The method as recited in claim 1, wherein the buffer layer includes germanium deposited on the transparent electrode.

3. The method as recited in claim 1, wherein performing a high power flash deposition includes depositing a thickness of less than about 5 nm in less than about 5 seconds.

4. The method as recited in claim 1, wherein performing a high power flash deposition includes providing a plasma enhanced chemical vapor deposition at a power of between about 100 mW/cm$^2$ and about 100 W/cm$^2$, wherein the low power deposition has a power between about 1.0 mW/cm$^2$ to about 100 mW/cm$^2$, wherein the power of the lower power deposition is less than the power of the high power flash deposition.

5. The method as recited in claim 1, wherein performing a high power flash deposition includes pulsing the high power flash deposition to form multiple thicknesses of high power flash deposited material in a same layer.

6. The method as recited in claim 1, wherein depositing the one or more layers includes depositing layers with increased crystallinity for a p-type layer and a buffer layer, the buffer layer being formed between a transparent electrode on the substrate and the p-type layer.

7. The method as recited in claim 1, wherein the high power flash deposition is performed before the low power deposition.

8. The method as recited in claim 1, wherein the high power flash deposition is performed after the low power deposition.

9. The method as recited in claim 1, wherein the Schottky barrier is eliminated.

10. A method for forming a photovoltaic device, comprising:

providing a substrate including a transparent electrode; and depositing a buffer layer of a single material layer of silicon germanium directly on the transparent electrode of zinc oxide and between and in direct contact with said transparent electrode and a p-type layer of hydrogenated silicon in a photovoltaic stack using a chemical vapor deposition (CVD) apparatus that includes a high power generator and a low power generator that separate power generators and are both in communication to an electrode in a single deposition chamber of the CVD apparatus, the p-type layer of hydrogenated silicon having a germanium content less than the buffer layer, and the buffer layer comprising a p-type dopant selected from a group consisting of Ga, In and a combination thereof, the depositing of the buffer layer including the steps of:

performing a high power flash deposition for depositing a first portion of the buffer layer to increase crystallinity and conductivity of the buffer layer on the substrate within the single deposition chamber, the high power flash deposition employing only the high power generator, wherein the high power flash deposition forms a first portion of the germanium containing material layers having a increasing crystallinity with increasing depth;

performing a low power deposition for depositing a second portion of the buffer layer and having a more amorphous form on the substrate within the single deposition chamber, the lower power deposition employing only the low power generator, wherein the low power deposition forms a second portion of the germanium containing material layers that is amorphous to provide the single layer for the buffer layer of silicon germanium and having a varying crystal structure having said first portion with said increasing crystallinity with said increasing depth and said second portion being said amorphous, wherein the increasing crystallinity is in a direction towards the p-type layer of hydrogenated silicon to provide for alignment of a conduction band of the buffer layer and the p-type layer of hydrogenated silicon to reduce a Schottky barrier between the buffer layer and the p-type layer of hydrogenated silicon; and forming an intrinsic layer of amorphous silicon on the p-type layer of hydrogenated silicon carbide and an n-type silicon layer to provide a PIN junction.

11. The method as recited in claim 10, wherein the buffer layer includes germanium deposited on the transparent electrode.

12. The method as recited in claim 10, wherein performing a high power flash deposition includes depositing a thickness of less than about 5 nm in less than about 5 seconds.

13. The method as recited in claim 10, wherein performing a high power flash deposition includes providing a plasma enhanced chemical vapor deposition at a power of between about 100 mW/cm$^2$ and about 100 W/cm$^2$, wherein the low power deposition has a power between about 1.0 mW/cm$^2$ to about 100 mW/cm$^2$, wherein the power of the lower power deposition is less than the power of the high power flash deposition.

14. The method as recited in claim 10, wherein performing a high power flash deposition includes pulsing the high power flash deposition to form multiple thicknesses of high power flash deposited material in a same layer.

15. The method as recited in claim 10, further comprising depositing the p-type layer by performing a high power flash deposition for depositing a first portion of the p-type layer and performing a low power deposition for depositing a second portion of the p-type layer.

16. The method as recited in claim 10, wherein the high power flash deposition is performed after the low power deposition.

17. The method as recited in claim 10, wherein the Schottky barrier is eliminated.

\* \* \* \* \*